(12) United States Patent
Bardsley

(10) Patent No.: US 7,067,788 B2
(45) Date of Patent: Jun. 27, 2006

(54) CONTROL LOOP APPARATUS OR CURRENT MEASURING CIRCUIT INCLUDING A CURRENT SENSOR OR METHOD OF CURRENT CALCULATION

(76) Inventor: Richard Bardsley, Agilent Technologies UK Limited, White House Rd., Ipswich IPI 5PB (GB)

( * ) Notice: Subject to any disclaimer, the term of this patent is extended or adjusted under 35 U.S.C. 154(b) by 390 days.

(21) Appl. No.: 10/459,602

(22) Filed: Jun. 12, 2003

(65) Prior Publication Data

US 2003/0233202 A1 Dec. 18, 2003

(30) Foreign Application Priority Data

Jun. 12, 2002 (EP) .................................. 02254068

(51) Int. Cl.
*H01J 40/14* (2006.01)
(52) U.S. Cl. ................................ 250/214 R; 250/214.1
(58) Field of Classification Search ............ 250/214 R, 250/214 A, 214 LA, 214 LS; 327/513, 514
See application file for complete search history.

(56) References Cited

U.S. PATENT DOCUMENTS 4,540,952 A   9/1985 Williams .................... 330/279
6,188,059 B1 * 2/2001 Nishiyama .............. 250/214 R

FOREIGN PATENT DOCUMENTS

EP    0 933 887 A2    1/1999

OTHER PUBLICATIONS

Patent Abstracts of Japan, Optical Reception Circuit, Pub. Feb. 5, 1983, Appln. Oct. 28, 1981, Appln. No. 56171353, NEC CORP., Shimodaira Risuke, vol. 007, No. 166 (E-188).
Patent abstracts of Japan, Gain Control Method for Avalanche Photodiode, Pub. May 25, 1993, Appln. Nov. 7, 1991, Appln. No. 03291226, Sumitomo Electric Ind. Ltd., Noma Takashi, vol. 17, No. 504 (E-1430).

* cited by examiner

*Primary Examiner*—Thanh X. Luu
*Assistant Examiner*—Tony Ko

(57) ABSTRACT

An avalanche photodiode having an operating voltage greater than a DC power supply rail is connected to the rail via a controlled DC-DC converter having an output voltage that drives the photodiode and meets the photodiode voltage supply needs. A measure of the current flowing from the rail to the converter determines the value of a control signal for the converter output voltage. The photodiode current is computed from the current measure and the control signal value.

23 Claims, 2 Drawing Sheets

Figure 1:
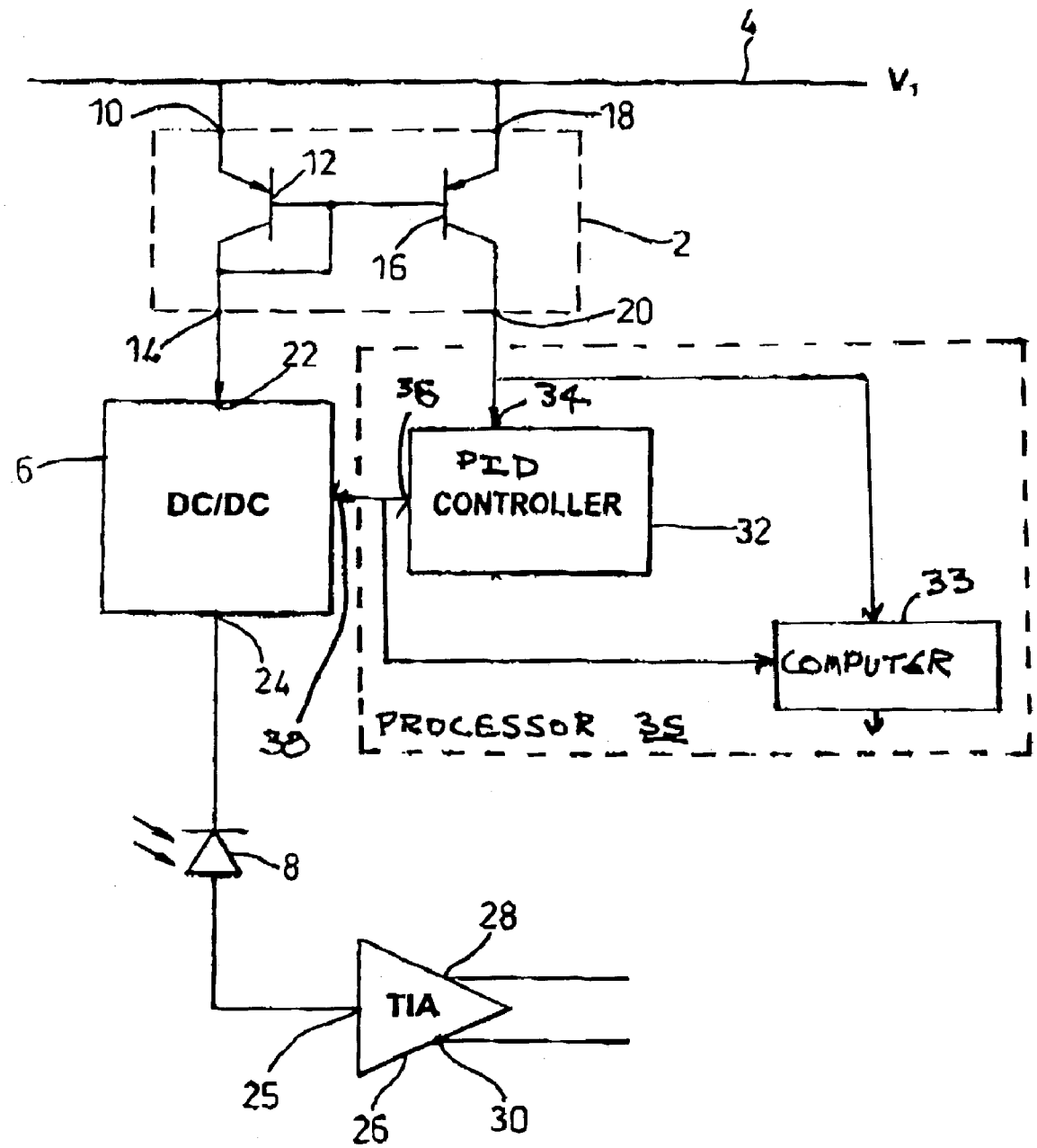

CONTROL LOOP APPARATUS OR CURRENT MEASURING CIRCUIT INCLUDING A CURRENT SENSOR OR METHOD OF CURRENT CALCULATION

RELATED APPLICATIONS

The present application is based on, and claims priority to European Application Serial Number 02254068.6, filed Jun. 12, 2002, the disclosure of which is hereby incorporated by reference herein in its entirety.

FIELD OF THE INVENTION

The present invention relates to a control loop apparatus of the type used, for example, to maintain correct operation of a current source, such as an Avalanche Photodiode (APD). The present invention also relates to a current measuring circuit of the type, for example, suitable for measuring a photocurrent flowing through the APD. Furthermore, the present invention also relates to a method of controlling a photodetector and measuring current.

BACKGROUND ART

In an optical communications network, optical data signals transmitted by a transmitter unit are received by a receiver unit. The receiver unit comprises a photodetector to collect optical electromagnetic radiation including the optical data signals and convert the collected optical data signals to electrical data signals for processing. One known circuit for collecting the optical data signals and converting the optical data signals to the electrical data signals comprises a reverse biased APD coupled between a positive supply rail and a transimpedance amplifier.

In order for the APD to reside in an operating state within a range of operating states so as to be capable of generating a sufficiently large photocurrent in response to optical electromagnetic radiation incident on the APD, a reverse bias voltage, for example about 70V, close to the breakdown voltage of the APD, is applied across terminals of the APD. To ensure optimum operation of the APD over temperature variations of the APD, a control loop is employed to maintain the photocurrent at an optimum level, since changes in temperature affect an optimum bias voltage of the APD. In addition to the effects of temperature, the manufacturing variances associated with APDs result in variations in the photocurrent. There is therefore a clear need to ensure that the photocurrent flowing through the APD is optimum.

To measure the photocurrent, it is known to employ a current mirror. Two candidate connections exist for coupling the current mirror to the APD. A first candidate connection is between the photodiode and a transimpedance amplifier, but this connection results in the introduction of unwanted noise. A second candidate connection is between the positive supply rail and the APD. However, in order to reverse bias the APD, the positive supply is set to, for example, about 70V, resulting in about 70V being applied across two transistor terminals of the current mirror, i.e. across a sensing input terminal and a monitoring output terminal. The current mirror with the second candidate connection is therefore difficult to implement.

SUMMARY OF THE INVENTION

According to a first aspect of the present invention, a current calculating apparatus for a detector requiring a relatively high voltage (e.g. 70 volts) to be applied across it for proper operation comprises a current sensor and the detector. The detector is coupled to an output of a voltage converter, and the current sensor is coupled to an input of the voltage converter. A current calculator calculates the amplitude of current flowing through the detector in response to a measure of current generated by the current sensor.

Preferably, the voltage converter is a DC/DC converter.

Preferably, the detector is a photodetector, more specifically a photodiode.

Preferably, the apparatus also comprises a transimpedance amplifier coupled to the detector.

The current sensor is preferably coupled to the input of the voltage converter via a current mirror. A first side of the current mirror is coupled to the input of the voltage converter and a second side of the current mirror is coupled to the current calculator via the current sensor.

In a first embodiment of the present invention, a control loop comprises the current calculating apparatus as set forth above in relation to the first aspect of the present invention. The control loop comprises a controller arranged to control the voltage converter in response to the calculated current flowing through the detector so as to control a voltage applied across the detector. It should be appreciated that the controller may comprise the current calculator.

In a second embodiment, a receiver circuit comprises the current calculating apparatus as set forth above in connection with the first aspect of the present invention, or the first embodiment.

In a third embodiment, a communications network comprises the current calculating apparatus as set forth above in connection with the first aspect of the present invention, or the first embodiment.

According to a second aspect of the present invention, there is provided a method of controlling a detector having a state of operation requiring a high voltage to be applied across it. The method comprises the steps of: applying a voltage across the detector; and controlling the voltage in response to a measure of current, the current being measured by a current sensor. The voltage is applied across the detector by a voltage converter in response to a measure of the current. The current sensor measures the current flowing into the voltage converter.

According to a third aspect of the present invention, there is provided a method of calculating a current flowing through a detector having a state of operation requiring a high voltage to be applied across it, wherein the detector is coupled to an output of a voltage converter, and a current sensor is coupled to an input of the voltage converter. The method comprises (1) measuring a current flowing into the voltage converter; and (b) calculating the current flowing through the detector based on parameters associated with the voltage converter and the measure of the current flowing into the voltage converter.

Preferably, the parameters associated with the voltage converter are: a supply voltage, a control voltage, a constant of proportionality of a multiplication factor, the multiplication factor, and an efficiency factor of the voltage converter.

According to a fourth aspect of the present invention, a voltage converter is used in combination with a current sensor and a controller to control a detector having a state of operation requiring a high voltage to be applied thereacross.

It is thus possible to provide a current measuring circuit apparatus and a method therefor that can calculate current flowing through the detector, thereby obviating the need to provide a current mirror or current measuring circuit downstream of the detector, or apply a high voltage across the current measuring circuit or the current mirror. Similar advantages also apply to the control loop circuit apparatus and method therefor.

Another aspect of the invention relates to the combination of: (1) a DC power supply terminal for a relatively low voltage; (2) a current sensor having a first input terminal and a first output terminal; (3) a DC to DC converter having a second input terminal and a second output terminal; and (4) a variable current source having an operating voltage greater than the low voltage. The converter is arranged so the second output terminal has a voltage sufficient to be the operating voltage of the current source. The first and second input and output terminals and the variable current source are connected in series. The current sensor and the DC to DC converter are arranged so the second output terminal has a current that is a function of the current flowing from the DC power supply terminal through the first input and output terminals. The second output terminal and the current source are connected in series so the same current flows in the second output terminal and the current source.

A further aspect of the invention concerns the combination of: (1) a current source; (2) a controllable DC to DC converter; and (3) a DC power supply terminal for connection to a DC voltage that is less than the voltage required for operation of the current source. The DC to DC converter is connected to be responsive to current flowing from the power supply terminal to the converter and arranged to supply to the current source a voltage sufficient to operate the current source. A controller responsive to an indication of the current flowing from the power supply terminal to the converter controls the voltage the converter applies to the current source.

Preferably, a processor connected to be responsive to indications of the current flowing from the power supply terminal to the converter and the voltage the controller supplies to the converter to control the voltage the converter supplies to the current source derives an indication of the current of the current source. The processor is preferably arranged to determine the indication of the current of the current source in accordance with $$\frac{I_1 Q}{V_c}$$

where $I_1$ and $V_C$ are respectively the indications of the current flowing from the power supply terminal to the converter and the voltage the controller supplies to the converter, and Q is a constant.

The invention has uses, for example, in optical communications systems, such as a Synchronous Optical NETwork (SONET).

BRIEF DESCRITIPN OF THE DRAWINGS

Figure 2:
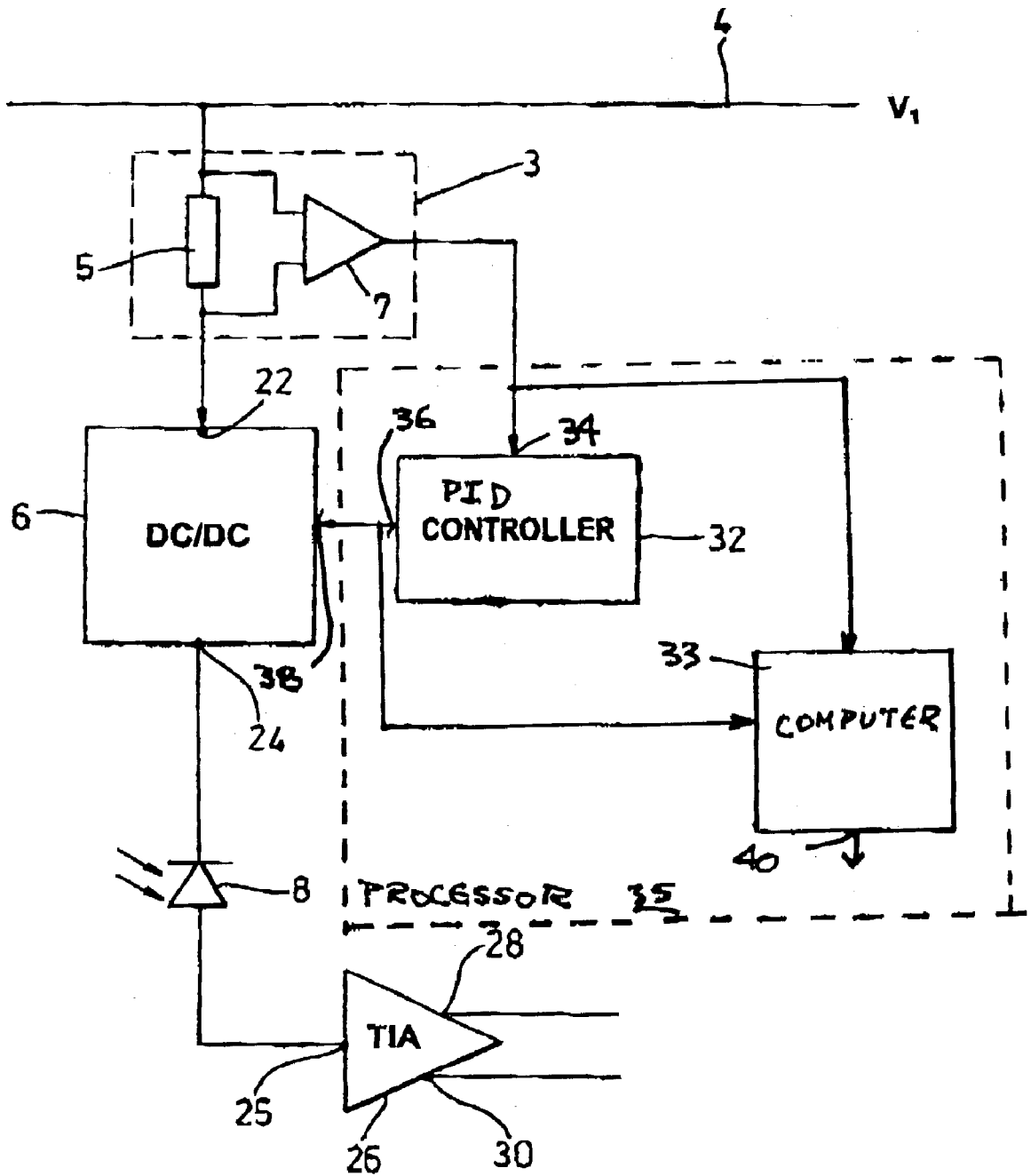

Two embodiments of the invention are now described, by way of example only, with reference to the accompanying drawing, in which:

FIG. 1 is a schematic diagram of a control circuit apparatus constituting an embodiment of the invention.; and FIG. 2 is a schematic diagram of an alternative embodiment to that of FIG. 1.

DETAILED DESCRIPTION OF THE DRAWINGS

A receiver of an optical communications network (not shown) includes a circuit for measuring the electric current a detector generates in response to optical energy the network supplies to the detector. The measuring circuit comprises a current mirror 2 coupled between a DC power supply rail 4 and a voltage controlled DC/DC voltage converter 6. In this example, the supply rail 4 is set at a first voltage $V_1$ of 5V. The current measuring circuit is coupled to a current generating transducer, i.e., detector, for example a photodetector such as an APD 8, in order to facilitate calculation of a photocurrent $I_P$ flowing through the APD 8 by measuring a current flowing into the voltage converter 6. The amplitude of $I_P$ is determined by the amount of optical energy the optical network causes to be incident on APD 8.

More specifically, a first half of the current mirror 2 comprises a first input terminal 10 DC coupled to the supply rail 4 and the emitter terminal of a first pnp bipolar transistor 12. The collector terminal of the first transistor 12 is DC coupled to a first output terminal 14 of the current mirror 2 and the base terminal of the first transistor 12. The base terminal of the first transistor 12 is also DC coupled to the base terminal of a second pnp bipolar transistor 16 forming a second half of the current mirror 2. The emitter terminal of the second transistor 16 is DC coupled to a second input terminal 18 of the current mirror 2. The second input terminal 18 is also DC coupled to the supply rail 4. The collector terminal of the second transistor 16 is DC coupled to a second output terminal 20 of the current mirror 2.

The first output terminal 14 of the current mirror 2 is DC coupled to a first input terminal 22 of the voltage converter 6. An output terminal 24 of the voltage converter 6 is DC coupled to the cathode of the APD 8, having an anode DC coupled to an input terminal 25 of transimpedance amplifier 26 having a non-inverting output terminal 28 and an inverting output terminal 30; input terminal 25 is at a virtual ground potential because of the high gain and feedback circuitry of amplifier 26. Hence, the voltage at terminal 24 is applied across APD 8.

Controller 32 controls the amplitude of the DC output voltage of converter 6 and, hence, the voltage applied across the APD 8. The controller 32 is, for example, any suitably programmed microcontroller, or an appropriately configured analogue circuit. Controller 32 and computer 33 (described infra) are included in processor 35 that is either of the analog or digital type.

The second output terminal 20 of the current mirror 2 is DC coupled to a first input terminal 34 of the controller 32. A first output terminal 36 of controller 32 is DC coupled to a second input terminal 38 of the voltage converter 6. The computer 33 has an output terminal 40 at which a measure of the photocurrent $I_P$ is derived to provide an indication of optical power incident on APD 8, thereby monitoring the strength of the optical signal received by the APD 8.

In operation, the controller 32 responds to the current at terminal 34 to generate a DC control voltage $V_C$ at the first output terminal 36. Under dark current conditions, i.e., with no optical energy incident on APD 8, the voltage that controller 32 supplies to converter 6 causes converter 6 to generate a reverse bias voltage $V_2$ of 70V across the APD 8. In response to optical energy being incident on APD 8, there is a slight change in $V_2$ (as described infra), but $V_2$ maintains APD 8 in the avalanche mode.

Of course, the reverse bias voltage $V_2$ of 70V is an example only, and other appropriate voltage levels can be applied across the APD 8, or other detector types can be used, depending upon the operating characteristics of that device. Converter 6 is employed because APD 8 must be reverse biased to a DC voltage greater than that of supply rail 4. Indeed, it is to be appreciated that if a detector other than APD 8 is employed, the biasing voltage of the detector is typically greater than the voltage available from the supply rail 4.

In order for the voltage converter 6 to generate the reverse bias voltage $V_2$, a first current $I_1$ flows into terminal 22 of the voltage converter 6 through the first transistor 12. The flow of the first current $I_1$ through transistor 12 of the current mirror 2 to terminals 4 and 22 causes a mirror current $I'_1$ to flow through the second transistor 16 to terminals 20 and 34. The mirror current $I'_1$ is used in conjunction with knowledge of the value of the first voltage $V_1$ and the reverse bias voltage $V_2$ to calculate the photocurrent $I_P$.

The photocurrent $I_P$ that APD 8 generates in response to the optical energy incident on the APD is converted to a voltage signal by the transimpedance amplifier 26, the voltage signal being present at the non-inverting output terminal 28 and an inverted representation of the voltage signal being present at the inverting output terminal 30.

The voltage converter 6 employs the principle:

$$\text{Power IN} = K_{\text{eff}} \text{ Power OUT} \quad (1)$$

Where $K_{\text{eff}}$ is the efficiency of voltage converter 6 in connecting between $V_1$ and $V_2$.

Hence, the output power of the voltage converter 6 is expressed as:

$$I_P V_2 = K_{\text{eff}} I_1 V_1 \quad (2)$$

Rearranging:

$$I_P = K_{\text{eff}} I_1 \frac{V_1}{V_2} \quad (3)$$

Since a multiplication factor, M, is associated with the voltage converter 6, the reverse bias voltage $V_2$ can be expressed as follows:

$$V_2 = M V_1 \quad (4)$$

Substituting this expression (4) into equation (3), the photocurrent $I_P$ is given as:

$$I_P = K_{\text{eff}} \frac{I_1}{M} \quad (5)$$

The multiplication factor M is set by the control voltage $V_C$; the control voltage $V_C$ being directly proportional to the multiplication factor M. A proportionality constant, k, therefore exists and so the relationship between $V_C$ and M is given by the following expression:

$$M = k V_C \quad (6)$$

Hence, substituting the expression (6) for the multiplication factor, M, into equation (5) above yields an expression for calculating the photocurrent $I_P$ in terms of the mirror current $I'_1$ ($=I_1$), the efficiency $K_{\text{eff}}$, the constant of proportionality, k, and the control voltage $V_C$:

$$I_P = I'_1 \frac{K_{\text{eff}}}{k V_C} \quad (7)$$

A relationship therefore exists between the photocurrent $I_P$ and the control voltage $V_C$. Computer 33 responds to signals having values indicative of the magnitudes of $I'$ and $V_C$, as respectively coupled to terminal 34 and derived from terminal 3, to calculate $I_P$ in accordance with Equation (7), where $K_{\text{eff}}$ is the efficiency of converter 6 and k is a proportionality constant of the converter. Converter 6 is controlled by $V_C$ such that the converter output current (i.e., $I_2 = I_P$) is inversely proportional to $V_C$, as indicated by Equations (5) and (6). In this example, the controller 32 is suitably programmed to employ a negative feedback loop to maintain the photocurrent $I_P$ at an optimum level. The negative feedback loop includes a control algorithm of the type employed, for example, in a Proportional Integral Differential (PID) control algorithm.

Consequently, if the controller 32 senses that, for the first current $I_1$ being drawn by the voltage converter 6 and the control voltage $V_C$, the voltage converter 6 starts to draw too much current, the controller 32 deduces that the reverse bias voltage $V_2$ is exceeding the breakdown voltage of the APD 8, since in this example, at the maximum power of the optical input signal, the photocurrent $I_P$ does not exceed 1 mA. In response to the reverse bias voltage $V_2$ exceeding the breakdown voltage, indicated by current $I'_1$ flowing to terminal 34, the controller 32 lowers the multiplication factor M by adjusting the control voltage $V_C$.

The calculated photocurrent $I_P$ is made available at the output terminal 40 of the computer 33.

In another embodiment, the controller 32 is provided with additional input terminals (not shown) to receive additional data, for example age and temperature data. Alternatively, this information can be pre-programmed into the controller 32. The controller 32 uses the additional data to bias the control voltage $V_C$, thereby compensating for any changes in performance in the APD 8 due to changes in temperature of the APD 8 and the age of the APD 8.

In a further embodiment, illustrated in FIG. 2, current sensing is carried out external to the controller 32 by a current sensor 3 replacing the current mirror 2. In this example, a resistor 5 is coupled between the supply rail 4 and the first input terminal 22 of the voltage converter 6. Input terminals of an operational amplifier 7 are coupled across the resistor 5 and an output terminal of the operational amplifier 7 is coupled to the first input terminal 34. In this example, the controller 32 is adapted to compensate for losses incurred by the introduction of the external current sensor 3 in place of the current mirror 2.

It should be appreciated that the above examples can be implemented in the analogue or digital domains. Furthermore, although in the above examples the APD 8 is positively biased, it should be appreciated that the above examples can be easily adapted to cater of APDs, or other detectors, requiring a negative bias voltage to be applied thereacross.

The invention claimed is:

1. A current calculating apparatus for a detector having a state of operation requiring a high voltage to be applied thereacross, the apparatus comprising a current sensor, the detector, a voltage converter and a current calculator, the detector being connected to be responsive to an output of the voltage converter, the current sensor being connected to an input of the voltage converter, the current calculator being arranged to calculate the current flowing through the detector in response to a measure of current generated by the current sensor, and a current mirror, a first side of the current mirror being connected to drive the input of the voltage converter, and a second side of the current mirror being connected to drive the current calculator.

2. An apparatus as claimed in claim 1, wherein the voltage converter is a DC/DC converter.

3. An apparatus as claimed in claim 1, wherein the detector is a photodetector.

4. An apparatus as claimed in claim 1, wherein the photodetector is a photodiode.

5. An apparatus as claimed in claim 1, further comprising a transimpedance amplifier coupled to the detector.

6. A receiver circuit including the current calculating apparatus as claimed in claim 1.

7. A communications network including the current calculating apparatus as claimed in claim 1.

8. A current calculating apparatus for a detector having a state of operation requiring a high voltage to be applied thereacross, the apparatus comprising a current sensor, the detector, a voltage converter and a current calculator, the detector being connected to be responsive to an output of the voltage converter, the current sensor being connected to an input of the voltage converter, the current calculator being arranged to calculate the current flowing through the detector in response to a measure of current generated by the current sensor, and a controller arranged to control the voltage converter in response to the calculated current flowing through the detector so as to control a voltage applied across the detector.

9. A method of calculating a current flowing through a detector having a state of operation requiring a high voltage to be applied thereacross, the detector being coupled to an output of a voltage converter, and a current sensor being coupled to an input of the voltage converter, the method comprising the steps of:
measuring a current flowing into the voltage converter; and
calculating the current flowing through the detector based on the values of parameters associated with the voltage converter and the measure of the current flowing into the voltage converter,
the parameters associated with the voltage converter being a supply voltage, a control voltage, a constant of proportionality of a multiplication factor, the multiplication factor, and an efficiency factor of the voltage converter.

10. In combination, a DC power supply terminal for a relatively low voltage; a current sensor having a first input terminal and a first output terminal; a DC to DC converter having a second input terminal and a second output terminal; a variable current source having an operating voltage greater than the low voltage; the converter being arranged so the second output terminal has a voltage sufficient to be the operating voltage of the current source; the first and second input and output terminals and the variable current source being connected in series; the current sensor and the DC to DC converter being arranged so the second output terminal has a current that is a function of the current flowing from the DC power supply terminal through the first input and output terminals; the second output terminal and the current source being connected in series so the same current flows in the second output terminal and the current source.

11. The combination of claim 10 wherein the current sensor includes a signal output terminal for deriving a signal having a value proportional to the current flowing between the first input and output terminals and the converter includes a signal input terminal; and further including a controller having an input terminal connected to be responsive to the signal at the first output terminal and a third output terminal for supplying a control voltage to the converter signal input terminal; the controller, sensor and converter being connected and arranged so the signal at the third output terminal is directly proportional to the current at the first output terminal and inversely proportional to the current at the second output terminal.

12. The combination of claim 11 further including a processor connected to be responsive to the signal indicative of the current flowing through the first output terminal and the amplitude of the control voltage for deriving an indication of the current generated by the current source.

13. The combination of claim 12 wherein the indication of the current generated by the current source is derived in accordance with $$\frac{I_1 Q}{V_c}$$

where $I_t$ is the amplitude of the current flowing from the first terminal to the second terminal, $V_C$ is the amplitude of the control voltage, and Q is a constant.

14. The combination of claim 11 wherein the current source includes a photodiode.

15. The combination of claim 11 wherein the current source includes an avalanche photodiode.

16. The combination of claim 11 wherein the current sensor includes a current mirror having a first transistor including first and second electrodes respectively connected to the first input and output terminals and a second transistor including an electrode connected to the current sensor signal output terminal.

17. The combination of claim 11 wherein the current sensor includes a resistor having first and second terminals respectively connected to the first input and output terminals, and a circuit connected to be responsive to the voltage between the first and second terminals of the resistor for coupling a signal indicative of the voltage between the first and second terminals of the resistor to the current sensor signal output terminal.

18. The combination of claim 10 wherein the current source includes a photodiode.

19. In combination, a current source; a controllable DC to DC converter; a DC power supply terminal for connection to a DC voltage that is less than the voltage required for operation of the current source; the DC to DC converter being connected to be responsive to current flowing from the power supply terminal to the converter and arranged to supply to the current source a voltage sufficient to operate the current source; and a controller arranged to be responsive to an indication of the current flowing from the power supply terminal to the converter for controlling the voltage the converter applies to the current source.

20. The combination of claim 19 wherein the current source includes a transducer for converting an environmental effect into a current.

21. The combination of claim 20 wherein the transducer comprises a photodiode.

22. The combination of claim 19 further including a processor connected to be responsive to indications of the current flowing from the power supply terminal to the converter and a voltage the controller is arranged to supply to the converter to control the voltage the converter supplies to the current source for deriving an indication of the current of the current source.

23. The combination of claim 22 wherein the processor is arranged to determine the indication of the current of the current source in accordance with $$\frac{I_1 Q}{V_c}$$

where $I_1$, and $V_C$ are respectively the indications of the current flowing from the power supply terminal to the converter and the voltage the controller supplies to the converter, and Q is a constant.

* * * * *

UNITED STATES PATENT AND TRADEMARK OFFICE
CERTIFICATE OF CORRECTION

PATENT NO. : 7,067,788 B2 Page 1 of 1
APPLICATION NO. : 10/459602
DATED : June 27, 2006
INVENTOR(S) : Richard Bardsley It is certified that error appears in the above-identified patent and that said Letters Patent is hereby corrected as shown below:

Title page, Column 1, (Title), Line 3, after "SENSOR OR" insert -- CALCULATOR OR --;

Column 1, (Title), Line 3, after "SENSOR OR" insert -- CALCULATOR OR --;

Column 8, Line 33, Claim 13, delete "$I_t$" and insert -- $I_1$ --.

Signed and Sealed this

Eighth Day of June, 2010

David J. Kappos
*Director of the United States Patent and Trademark Office*